United States Patent
Eberhard et al.

(10) Patent No.: US 8,723,199 B2
(45) Date of Patent: May 13, 2014

(54) RADIATION EMITTING BODY AND METHOD FOR PRODUCING A RADIATION-EMITTING BODY

(75) Inventors: Franz Eberhard, Regensburg (DE); Reiner Windisch, Pettendorf (DE); Robert Walter, Parsberg (DE); Michael Schmal, Schmidmühlen (DE); Magnus Ahlstedt, Regensburg (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 564 days.

(21) Appl. No.: 12/811,030

(22) PCT Filed: Dec. 19, 2008

(86) PCT No.: PCT/DE2008/002136
§ 371 (c)(1),
(2), (4) Date: Oct. 5, 2010

(87) PCT Pub. No.: WO2009/083001
PCT Pub. Date: Jul. 9, 2009

(65) Prior Publication Data
US 2011/0198639 A1    Aug. 18, 2011

(30) Foreign Application Priority Data

Dec. 27, 2007 (DE) .......... 10 2007 062 790
May 21, 2008 (DE) .......... 10 2008 024 517

(51) Int. Cl.
H01L 33/00 (2010.01)
(52) U.S. Cl.
USPC .......... 257/98; 257/E33.06; 438/29
(58) Field of Classification Search
None
See application file for complete search history.

(56) References Cited

U.S. PATENT DOCUMENTS

2003/0057444 A1  3/2003  Niki et al.
2003/0111667 A1  6/2003  Schubert
(Continued)

FOREIGN PATENT DOCUMENTS

CN         1905219         1/2007
DE   10 2006 017 573    10/2007
(Continued)

OTHER PUBLICATIONS

Office Action dated Apr. 9, 2013 issued in the corresponding Japanese Patent Application No. 2010-540027.
(Continued)

*Primary Examiner* — Marvin Payen
(74) *Attorney, Agent, or Firm* — Cozen O'Connor

(57) ABSTRACT

A radiation-emitting body comprising a layer sequence, having an active layer (10) for generating electromagnetic radiation, having a reflection layer (50), which reflects the generated radiation, and having at least one intermediate layer (40) arranged between the active layer (10) and the reflection layer (50). In this case, the active layer (10) has a roughening on an interface (15) directed toward the reflection layer (50), and the reflection layer (50) is substantially planar at an interface (45) directed toward the active layer (10). Also disclosed is a method for producing a radiation-emitting body, which involves forming a layer sequence on a substrate having an active layer (10) for generating electromagnetic radiation. In this case, the method comprises roughening an interface (15) on the active layer (10), and forming at least one intermediate layer (40) and a reflection layer (50).

13 Claims, 2 Drawing Sheets

(56) References Cited

U.S. PATENT DOCUMENTS

| | | |
|---|---|---|
| 2004/0051109 A1 | 3/2004 | Ishizaki et al. |
| 2004/0135166 A1 | 7/2004 | Yamada et al. |
| 2005/0110009 A1 | 5/2005 | Blochwitz-Nimoth et al. |
| 2005/0110037 A1 | 5/2005 | Takeda et al. |
| 2005/0242364 A1 | 11/2005 | Moustakas et al. |
| 2006/0011923 A1 | 1/2006 | Eisert et al. |
| 2006/0222040 A1 | 10/2006 | Schmid et al. |
| 2007/0012933 A1 | 1/2007 | Lee et al. |
| 2007/0080352 A1 | 4/2007 | Wu et al. |
| 2007/0176162 A1* | 8/2007 | Kang ............... 257/14 |
| 2007/0194324 A1 | 8/2007 | Kim et al. |
| 2007/0275489 A1 | 11/2007 | Zhou |
| 2008/0173863 A1 | 7/2008 | Hahn et al. |
| 2009/0146165 A1* | 6/2009 | Hasnain et al. ........ 257/98 |
| 2012/0164770 A1 | 6/2012 | Hahn et al. |

FOREIGN PATENT DOCUMENTS

| | | |
|---|---|---|
| DE | 10 2007 002 416 | 10/2007 |
| DE | 10 2997 002 416 | 10/2007 |
| EP | 1 119 878 | 10/2007 |
| EP | 1 845 564 | 10/2007 |
| JP | 2002-170993 | 6/2002 |
| JP | 2003-318441 | 11/2003 |
| JP | 2004-146539 | 5/2004 |
| JP | 2005-513787 | 5/2005 |
| JP | 2005-158904 | 6/2005 |
| JP | 2005-175462 | 6/2005 |
| JP | 2006-157024 | 6/2006 |
| JP | 2006-269807 | 10/2006 |
| JP | 2007-150304 | 6/2007 |
| JP | 2007-288195 | 11/2007 |
| JP | 2007-305909 | 11/2007 |
| JP | 2007-533164 | 11/2007 |
| JP | 2007-318157 | 12/2007 |
| WO | WO 2006/006822 | 1/2006 |
| WO | WO 2007/054345 | 5/2007 |
| WO | WO 2007/105626 | 9/2007 |

OTHER PUBLICATIONS

Schnitzer, I., et al.: "30% external quantum efficiency from surface textured, thin-film light-emitting diodes", Applied Physics Letters vol. 63, No. 16, pp. 2174-2176, Oct. 18, 1993.

Prof. Saraswat, "Deposition & Planarization", EE 311 Notes.

Frost, F., et al. "Smoothing of Diamond-Turned Copper Surfaces Using Ion Beams with Aid of Planarizing Film", Japanese Journal of Applied Physics, vol. 46, No. 9A, 2007, pp. 6071-6073.

T. Mitra, "Study of the destruction threshold of mirrors for the infrared laser photo chemistry in a multi-reflection cell", Mar. 1998, p. 8, No. 2.2.3.

http:/de.Wikipedia.org/wiki/Ionenplattieren (abstract).

* cited by examiner

RADIATION EMITTING BODY AND METHOD FOR PRODUCING A RADIATION-EMITTING BODY

RELATED APPLICATIONS

This is a U.S. national stage under 35 USC §371 of application No. PCT/DE2008/002136, filed on Dec. 19, 2008.

This patent application claims the priority of the German patent applications DE 10 2007 062 790.6 filed Dec. 27, 2007 and DE 10 2008 024 517.8 filed May 21, 2008, the disclosure content of both of which is hereby incorporated by reference.

FIELD OF THE INVENTION

The present invention is related to a radiation-emitting body having an active layer for generating electromagnetic radiation.

BACKGROUND OF THE INVENTION

The document DE 10 2007 002 416 A1 describes a radiation-emitting body and a method for producing a radiation-emitting body.

SUMMARY OF THE INVENTION

It is an object of the invention to improve the efficiency of the coupling-out of radiation from the radiation-emitting body by comparison with the prior art.

It is furthermore an object of the invention to specify provide a method for producing such a radiation-emitting body.

In accordance with at least one embodiment, the radiation-emitting body comprises a layer sequence, having an active layer for generating electromagnetic radiation, having a reflection layer, which reflects the generated radiation, and having at least one intermediate layer arranged between the active layer and the reflection layer.

Furthermore, a method for producing a radiation-emitting body is specified. In accordance with at least one embodiment of the method, the method involves forming a layer sequence on a substrate, having an active layer for generating electromagnetic radiation.

The active layer has a roughening on the interface directed toward the reflection layer, and the reflection layer is substantially planar at an interface directed toward the active layer.

In this case, planar should be understood to mean a smooth surface which, even on the microscopic scale, is still virtually free of roughnesses.

An embodiment of the method comprises roughening an interface of the active layer, forming the at least one intermediate layer, and forming a reflection layer.

An interface of the active layer which is directed toward the reflection layer is roughened on its surface. The reflection layer is formed in substantially planar fashion at its interface directed toward the active layer. An electromagnetic radiation emitted by the active layer is scattered at the roughening of the interface of the active layer, and the scattered electromagnetic radiation is reflected back at the reflection layer. A separation of the physical effects of scattering and reflection is thus achieved by means of the measures described.

The advantage in this case is that an effect referred to as the abnormal skin effect is avoided. In the case of electromagnetic radiation, in particular also in the case of electromagnetic rays, the wavelengths of which lie in the visible range of light, the abnormal skin effect leads to a partial absorption of the energy of the radiation and thus reduces the energy of the coupled-out electromagnetic rays.

The abnormal skin effect is based on surface absorption. Microroughnesses of the surfaces can increase the absorption in the infrared wavelength range of electromagnetic waves by 50%. This increase in absorption occurs even in the case of roughnesses which are too small to cause diffuse scattering in the infrared wavelength range. Every material has a specific optical penetration depth for electromagnetic waves, wherein said optical penetration depth is dependent on the respective wavelength. The optical penetration depth describes the distance covered by the electromagnetic radiation in a material after the intensity, in the case of perpendicular incidence, has decreased by a predetermined proportion. For wavelengths in the infrared wavelength range, the penetration depth in the case of silver, by way of example, is 22 nm at room temperature. In the case of other materials, such as gold or copper, the penetration depth is similarly approximately 20 nm for a wavelength of 10 μm.

This abnormal skin effect occurs for example even when an electromagnetic wave having a wavelength in the range of visible light impinges on an interface embodied in such a way that it has scattering and reflective properties. The invention advantageously avoids this effect. As a result of the separation of the physical effects of scattering and reflection of an electromagnetic ray, of a light ray, which is achieved by separate formation of an interface having scattering properties and an interface having reflective properties, the absorption of energy as a result of the abnormal skin effect is avoided. An increase in the efficiency of the coupling-out of radiation of the radiation-emitting body is thus achieved.

The intermediate layer is preferably substantially transmissive to the electromagnetic wave generated by the active region. Consequently, the electromagnetic wave impinging on the intermediate layer passes through the intermediate layer and is reflected at the reflection layer.

Preferably, the material of the intermediate layer has a refractive index that differs from the refractive index of the material of the active layer; preferably, the refractive index of the material of the intermediate layer is less than the refractive index of the material of the active layer. The refractive index is a physical variable in optics. It indicates the refraction of an electromagnetic wave at the transition between two media.

The roughening is preferably formed by virtue of the fact that the surface of the active layer, and hence the interface between the active layer and the intermediate layer has a lateral structuring composed of a multiplicity of projecting structure elements.

The text above and below describes effects and properties of the radiation-emitting body by means of a frequency or a wavelength of an electromagnetic radiation. The term electromagnetic radiation or electromagnetic wave denotes a wave composed of coupled electric and magnetic fields. The latter include, inter alia, radio waves, microwaves, infrared radiation, visible light, UV radiation and also X-ray and gamma radiation—in short, the entire spectrum of electromagnetic waves. The only difference between these wave types resides respectively in their frequency and thus also in their energy. However, there is a continuous frequency spectrum over the entire frequency range from above 1023 Hz to below 102 Hz. Within this spectrum there is differentiation according to the wave or ray types designated above. The differentiation thus formed is based on the properties of the radiation that change continuously with frequency, or the origin thereof, and also on the different uses or production methods dependent thereon, or the different measurement methods used therefor.

In accordance with one preferred embodiment, the layer sequence of the radiation-emitting body comprises a semiconductor layer sequence. The latter in turn comprises the active layer, which has a pn junction. A pn junction denotes a material junction of semiconductor crystals having different doping, that is to say regions in which the doping changes from negative (n) to positive (p). The special feature of the pn junction is the formation of a space charge zone, in which lack of free charge carriers prevails, and of an internal electric field, of a so-called depletion layer, as long as no electrical voltage is applied to the component. By way of example, the active layer can have a quantum well structure, wherein the quantum well structure designates any structure in which charge carriers experience a quantization of their energy states as a result of confinement. A quantum well is understood to mean a potential profile which restricts the freedom of movement of a particle in one spatial dimension, such that only a planar region can be occupied. The width of the quantum well crucially determines the quantum mechanical states that can be assumed by the particle. This leads, in particular, to the formation of energy levels. The particle can then assume only discrete potential energy values. In particular, the designation quantum well structure does not include any indication about the dimensionality of the quantization. It therefore encompasses, inter alia, quantum wells, quantum wires and quantum dots and any combination of these structures. The layer sequence preferably contains a phosphide-, arsenide- or nitride-based compound semiconductor material. These materials are suitable for generating radiation having a wavelength principally in the blue to infrared range of the optical spectrum.

In this context, phosphide-based compound semiconductor material means that the material preferably comprises $Al_nGa_mIn_{1-n-m}P$ where $0 \le n \le 1$, $0 \le m \le 1$ and $n+m \le 1$. In this case, this material need not necessarily have a mathematically exact composition according to the above formula. Rather, it can comprise one or a plurality of dopants and also additional constituents which, however, substantially do not change the physical properties of the material. For the sake of simplicity, however, the above formula comprises only the essential constituents of the crystal lattice (Al, Ga, In, P), even if these can be replaced in part by small amounts of further substances.

In this context, phosphide-based compound semiconductor material also means that the material preferably comprises $Ga_nIn_{1-n}As_mP_{1-m}$ where $0 \le n \le 1$, $0 \le m \le 1$. In this case, this material need not necessarily have a mathematically exact composition according to the above formula. Rather, it can comprise one or a plurality of dopants and also additional constituents which, however, substantially do not change the physical properties of the material. For the sake of simplicity, however, the above formula comprises only the essential constituents of the crystal lattice (Ga, In, As, P), even if these can be replaced in part by small amounts of further substances.

Correspondingly, nitride-based compound semiconductor material means that the material comprises a nitride III/V compound semiconductor material, preferably $Al_nGa_mIn_{1-n-m}N$ where $0 \le n \le 1$, $0 \le m \le 1$ and $n+m$ 1. In this case, this material need not necessarily have a mathematically exact composition according to the above formula. Rather, it can comprise one or a plurality of dopants and also additional constituents which substantially do not change the characteristic physical properties of the material. For the sake of simplicity, however, the above formula comprises only the essential constituents of the crystal lattice (Al, Ga, In, N), even if these can be replaced in part by small amounts of further substances.

Correspondingly, arsenide-based compound semiconductor material means that the material preferably comprises $Al_nGa_mIn_{1-n-m}As$ where $0 \le n \le 1$, $0 \le m \le 1$ and $n+m \le 1$. In this case, this material need not necessarily have a mathematically exact composition according to the above formula. Rather, it can comprise one or a plurality of dopants and also additional constituents which, however, substantially do not change the physical properties of the material. For the sake of simplicity, however, the above formula comprises only the essential constituents of the crystal lattice (Al, Ga, In, As), even if these can be replaced in part by small amounts of further substances.

Preferably, the radiation-emitting body is a thin-film semiconductor body. That is to say that a growth substrate for the epitaxially produced radiation-emitting body is thinned or completely removed. A basic principle of a thin-film semiconductor body is described for example in I. Schnitzer et al., Appl. Phys. Lett. 63 (16), Oct. 18, 1993, 2174 to 2176.

The disclosure content of said document in this respect is hereby incorporated by reference.

A radiation-emitting thin-film semiconductor body is to a good approximation a Lambertian surface emitter and is particularly well suited to backlighting, illumination and/or display purposes. A Lambert emitter is a physically ideal emitter. The radiance or the luminance of a Lambertian emitter is constant in all directions.

The structure elements on the interface of the active layer with respect to the intermediate layer are particularly effective if they optionally have a structure size which either lies in the range of the wavelength of the radiation passing through the structure elements or is greater than that. The structure size lies in the range of the wavelength if it is equal to or greater than half the wavelength and less than or equal to double the wavelength. As an alternative, the structure size can be greater than the wavelength to the extent that the laws of geometric optics are applicable. The structure size is then upwardly limited only by the size of the radiation-emitting body and the thickness of the structured layer.

In the present case, the structure size should preferably be understood to mean at least one of the variables structure width or structure depth. The term structure width denotes the width of the structure element, measured in a lateral direction, and the term structure depth denotes the depth of the structure element, measured in a vertical direction. If there are structure elements having different structure sizes at least in parts, then the structure size lies in the range of the wavelength of the emitted electromagnetic radiation and/or is greater than that. In the present case, a wavelength range of 50 to 1000 nm should preferably be understood as the range of the wavelength, but structure sizes of less than 50 nm are also possible.

The reflection layer preferably contains a metal or is embodied as a metallic layer. Preferably, said metallic layer comprises a sequence of metallization layers composed, for example, of Ti—Ag—Ti (titanium-silver-titanium). The different metals have different tasks in this case; thus, the first Ti layer serves as an adhesion promoter, followed by an Ag layer acting as a reflector. The second Ti layer serves as a protective layer during subsequent processes during the production of the radiation-emitting body. The first Ti layer functioning as an adhesion promoter layer also has an influence on the reflection and is part of the reflection layer. Advantageously, through the metallic layer or layer sequence, the radiation-emitting body can be electrically terminated by means of the reflection layer. In conjunction with a metalized reflection layer and an electrically conductive intermediate layer, an electrical supply of the active region of the radiation-emitting body can advantageously be formed.

In accordance with at least one embodiment, the reflection layer contains at least one of the following metals: gold, silver, aluminum.

A metal which is particularly suitable for the reflection of the impinging radiation is expediently used. By way of example, a reflection layer containing silver or gold is particularly suitable in the case of a phosphorus-based compound semiconductor material and a reflection layer containing silver or aluminum is particularly suitable in the case of a nitride-based compound semiconductor material.

The reflection layer is preferably applied directly to the layer sequence. Preferably, the reflection layer is not self-supporting and is applied to the interface of the intermediate layer. By way of example, the reflection layer can be applied to the layer sequence by vapor deposition or sputtering; this allows an intimate connection of the reflection layer to the layer sequence. Particularly preferably, the reflection layer is connected to the layer sequence in a positively locking manner.

The intermediate layer can consist of a structured layer sequence composed of materials having different refractive indices. Furthermore, the intermediate layer can optionally be embodied such that it is electrically non-conductive or electrically conductive. In this case, a dielectric material, in particular SiN or $SiO_2$, is particularly suitable for an electrically non-conductive intermediate layer and an oxide, a TCO (transparent conductive oxide), in particular ITO (indium tin oxide), IZO (indium zinc oxide) or ZnO (zinc oxide), is particularly suitable for an electrically conductive intermediate layer. A material having a refractive index of close to 1 is preferably used. Advantageously, with an electrically conductive intermediate layer, the reflection layer can serve as an electrical contact of the radiation-emitting body and the supply of the active layer with electrical energy can be routed via the reflection layer and the intermediate layer.

As already described, the interface of the active layer with respect to the intermediate layer is roughened. In this case, the structure elements can have different structure sizes at least in parts. Furthermore, the structure elements can be distributed irregularly on the interface. In order to obtain a lateral structuring with a plurality of projecting structure elements on the interface, a surface of the active layer which adjoins the intermediate layer can have a plurality of structure elements. The intermediate layer is preferably applied on the surface of the active layer. Accordingly, that surface of the intermediate layer which is directed toward the active layer is positively locking with the structure of the surface of the active layer.

The method for producing the radiation-emitting body is specified below. In particular, the method is suitable for producing a radiation-emitting body in accordance with the configurations mentioned above. It should be pointed out that the method can be characterized not only by the features mentioned below but also by the features that were mentioned in connection with the radiation-emitting body, and vice versa. This may concern material indications or size indications, by way of example.

The method for producing a radiation-emitting body has the steps described below. The step of producing the active layer is followed by roughening an interface on the active layer and forming at least one intermediate layer. A reflection layer is furthermore formed.

The roughening is preferably effected by forming a lateral structuring. This involves forming a multiplicity of projecting structure elements which are arranged irregularly on the interface of the active layer that is directed toward the subsequently formed reflection layer.

The reflection layer is preferably formed after the intermediate layer, with the result that an interface is formed at the transition from the intermediate layer to the reflection layer. Said interface is substantially planar, with the result that radiation impinging there is reflected back into the intermediate layer. The intermediate layer is arranged between the active layer and the reflection layer.

In accordance with one preferred configuration, the layer sequence comprises an active layer, a semiconductor layer, which can advantageously be grown epitaxially on a substrate. The lattice constant of the material system is preferably matched to the lattice constant of the substrate.

The substrate is furthermore preferably stripped away in the course of the production of the body. This has the advantage, for example, that the radiation-emitting body can be produced with a small height. In this case, the layer sequence can alternatively be applied to an intermediate carrier, which stabilizes the layer sequence after the substrate has been stripped away. At the end, the intermediate carrier can also be stripped away, a carrier preferably being arranged in place of the stripped-away substrate.

The interface is preferably structured by means of natural lithography. This method can be described for example by the fact that balls are applied on the surface of the active layer, said balls adhering to the surface of the active layer. By means of a subsequent dry etching method, pillar-type structure elements remain at the locations at which the balls adhere. The space between the structure elements is etched away from the layer sequence by the dry etching process in respect thereof.

In this way, it is possible to form structure elements having a structure size in the range of the wavelength of the radiation impinging on the structure elements. By way of example, the structure width can be 300 nm and the structure depth can be 300 nm. Both structure width and structure depth thus lie in the range of the wavelength of the radiation-emitting body, which lies between 50 and 1000 nm.

Structure elements having a structure size which is significantly larger than the wavelength can be formed by means of wet-chemical etching or dry etching. In this case, the structure size is in the range of >4 μm.

Furthermore, known etching methods can be used for forming structure elements on the interface or for roughening the interface. Such etching methods are, for example, wet-chemical etching or dry etching, including reactive ion etching, ion beam etching or chemically assisted ion beam etching. Photolithography is particularly suitable for forming regular interface structures.

An intermediate layer is preferably formed on the roughened surface, by means of chemical or physical vapor deposition. Chemical vapor deposition can generally be described such that a solid component is deposited from the vapor phase at a heated surface on account of a chemical reaction. A prerequisite for this is that volatile compounds of the layer components exist which deposit the solid layer at a specific reaction temperature. The method of chemical vapor deposition is distinguished by at least one reaction at the surface of the workpiece to be coated. At least two gaseous starting compounds and at least two reaction products, of which at least one is gaseous and at least one is in the solid phase, have to participate in said reaction. Physical vapor deposition includes, for example, evaporation methods such as thermal evaporation, electron beam evaporation, laser beam evaporation, arc evaporation, molecular beam epitaxy or ion plating. What is common to all these methods is that the material to be deposited is present in solid form in the normally evacuated coating chamber. The material is evaporated by the bombardment with laser beams, magnetically deflected electrons and by arc discharge. The evaporated material moves through the chamber either ballistically or in a manner guided by electric fields and in this case impinges on the parts to be coated, where the layer formation occurs.

As an alternative to these coating methods already mentioned, the intermediate layer can preferably also be formed by a rotary coating method. In this case, a wafer is fixed on a turntable. By means of a metering device, a solution is applied over the center of the wafer in a desired quantity and the wafer is rotated. The solution is thereby distributed uniformly over the surface of the wafer and the surface is coated. Possibly excess material is hurled away from the wafer. Depending on the method, the surface of the intermediate layer is thus formed in more or less planar fashion. Therefore, a planarization is preferably provided, which a planar surface at the boundary layer formed with respect to a reflection layer yet to be applied is effected by mechanical polishing, for example.

The term wafer denotes a circular or square slice which is approximately 1 mm thick and which represents the substrate of the radiation-emitting body. The epitaxial layer construction with photoelectric layers for the production of a multiplicity of radiation-emitting bodies according to the invention is effected on said substrate.

The reflection layer, and likewise the intermediate layer, can be applied by means of the methods just mentioned.

BRIEF DESCRIPTION OF THE DRAWINGS

The invention is explained in greater detail below on the basis of an exemplary embodiment with reference to two figures, in which.

DETAILED DESCRIPTION OF THE DRAWINGS

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order that they can be better illustrated and/or in order to afford a better understanding.

Figure 1:
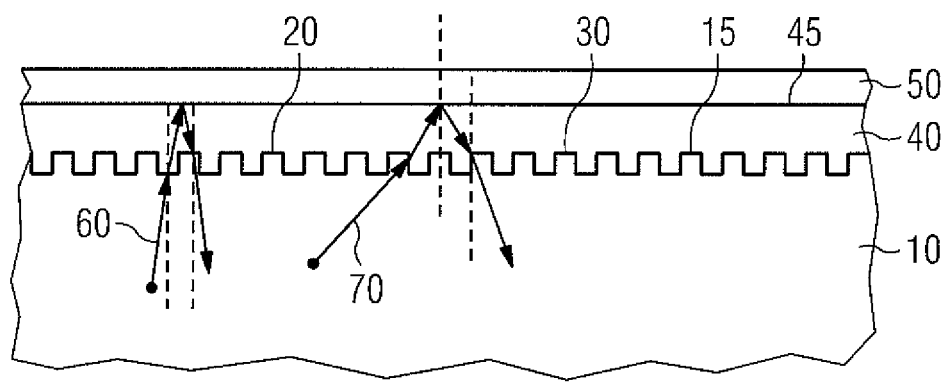
FIG. 1 shows a schematic cross-sectional view of layers of the radiation-emitting body.

FIG. 1 shows an active layer 10, which has a structuring 20 at its interface 15. The structuring 20 is embodied and depicted uniformly in the illustration, where this should be understood to mean a particular embodiment, but not a restriction of the subject matter of the invention to this feature of uniformity. The structuring 20 is formed from individual projecting structure elements 30, which are arranged in a multiplicity on the surface of the active layer 10 and thus form the interface 15 with respect to an intermediate layer 40.

The intermediate layer 40 is arranged in a positively locking manner on the surface of the active layer 10. In the exemplary embodiment illustrated, the intermediate layer 40 is arranged directly on the interface 15 of the active layer 10. However, it is also possible for a further layer to be arranged between the two layers, the intermediate layer 40 and the active layer 10, in a positively locking manner with respect to both layers. By way of example, particular properties such as, for example, filter properties or reflectivity of the arrangement can thus be altered and the radiation-emitting body can thus be optimized for a specific purpose of use. Thus, by way of example, the reflectivity of the overall arrangement can be increased by using a plurality of layers having different refractive indices. The intermediate layer is preferably formed with a thickness of 200 nm to 2000 nm.

The intermediate layer 40 has a refractive index that is different than the refractive index of the active layer 10, and preferably has minimum absorption. What is thereby achieved is that an electromagnetic beam is deflected at the interface 15 of the active layer 10 with respect to the intermediate layer 40. In this case, the structuring 20 fulfils the task of scattering. Each individual electromagnetic beam follows a specific direction in a medium such as the active layer 10. Upon a transition from one medium to another medium, the refractive index of which differs from that of the first medium, for example at the interface 15 from the active layer 10 to the intermediate layer 40, one part of the electromagnetic beam is reflected and a further part is deflected in accordance with Snell's law of refraction. This deflection takes place toward the perpendicular to the interface upon passing into a medium having a higher refractive index and away from the perpendicular to the interface upon passing into a medium having a lower refractive index. Furthermore, total reflection occurs if the angle of incidence of the electromagnetic beam exceeds a specific value. A deflection in different directions and thus a scattering of the electromagnetic beams are thus effected by the structuring 20 of the interface 15.

The intermediate layer 40 is formed with a planar surface at its interface 45 formed with respect to a reflection layer 50. The interface 45 is formed by a reflection layer 50 preferably formed from metal.

The reflection layer 50, if it is a metallic layer, is preferably formed with silver or gold since these materials are particularly suitable in the case of a radiation-emitting body comprising InGaAlP.

The thickness of the reflection layer 50 is chosen such that the impinging radiation does not penetrate through the reflection layer 50, but rather is substantially reflected at it. The thickness of the reflection layer 50 is preferably in the range of approximately 150 nm. If the reflection layer 50 contains a metal such as silver or gold, for example, it is simultaneously electrically conductive, whereby it advantageously becomes possible for the radiation-emitting body to be supplied with electrical energy by means of the reflection layer 50.

The reflection layer 50 has a substantially planar surface at the common interface 45 with the intermediate layer 40. Said surface is formed for example by means of a mechanical planarization method such as, for example, mechanical polishing and subsequent application of a metal layer. Other methods for producing a planar surface are also possible. Examples thereof are for example the use of a material which has a low melting point and which starts to flow during a thermal treatment at temperatures of less than 500° C. and thus forms a planar surface. Another possibility for producing a planar surface is afforded by so-called ion beam technology or etch-back technology. In the case of etch-back technology, the rough surface is coated with a photoresist and then "etched-back" by means of an ion beam, with the result that a smooth surface arises.

The reversal in the direction of the impinging radiation which occurs at the reflection layer 50 is based on reflection at the interface 45 between the intermediate layer 40 and the reflection layer 50.

An electromagnetic beam 60 which is generated in the active layer 10 and propagates toward the interface layer 15 is deflected at the interface layer 15. After passing through the interface layer 15, the electromagnetic beam 60 propagates further in the intermediate layer 40 in the deflected direction until it reaches the interface layer 45 of the reflection layer 50. At the latter, the electromagnetic beam 60 is reflected and propagates further in the direction of the interface layer 15. Upon penetrating through the interface layer 15 once again, the electromagnetic beam 60 is deflected once again and then penetrates through the active layer 10 until it leaves the latter and then the radiation-emitting body. An electromagnetic beam 70 which is likewise generated in the active layer 10, with a different propagation direction than the beam 60, impinges on the interface layer 15 at a different angle and at a different location and is deflected according to the same physical laws and ultimately reflected at the interface layer 45. Consequently, all electromagnetic beams penetrating through the interface layer 15 are scattered as a result of the structure of the interface layer 15.

FIG. 2 shows individual method steps for forming a radiation-emitting body in accordance with the principle described above.

Figure 2A:
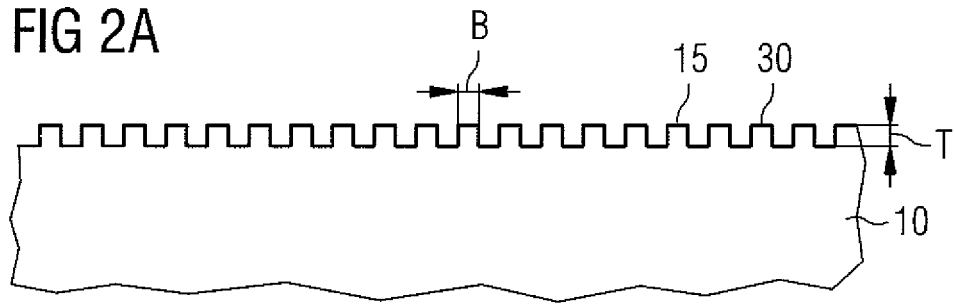
FIGS. 2A to 2D show a schematic step-by-step illustration of individual method steps for producing the radiation-emitting body.

In this case, FIG. 2A shows the active layer 10 with its structured surface, which forms the interface 15 with respect to the intermediate layer 40. The structure size of the structure elements 30 is typically in the range of the wavelength of the emitted electromagnetic radiation or is larger than that. In the present case, a wavelength range of 50 to 1000 nm should preferably be understood as the range of the wavelength, but structure sizes of smaller than 50 nm are also possible. The structure size concerns the width B and the depth T of the structure elements 30. Structure elements 30 of this type can be formed by means of one of the methods already mentioned above. The structure elements 30 are embodied uniformly in the illustration. This is a special form of the structuring 20, which can be formed for example by means of a photolithographic method with a subsequent etching process. By means of a natural lithographic method, it is also possible to form structure elements 30 which have different sizes and are arranged irregularly on the interface 15.

Figure 2B:
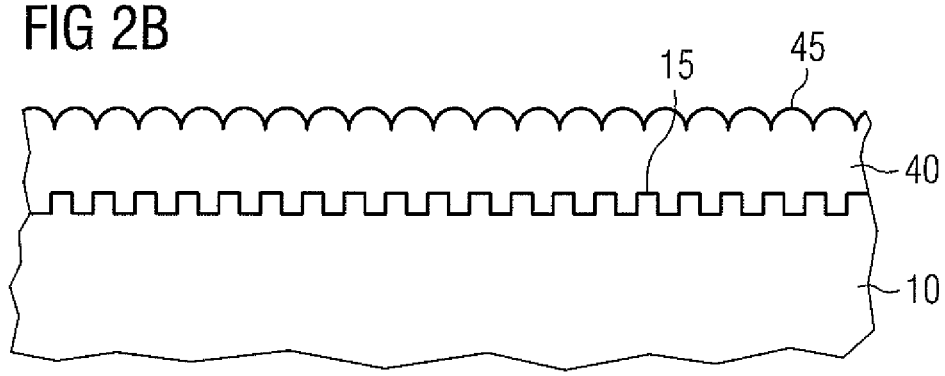
Figure 2C:
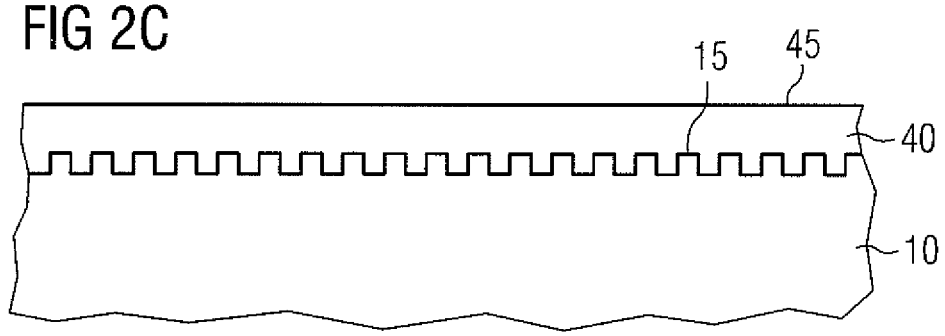

FIG. 2B shows the active layer 10 with its structured surface, which forms the interface 15 with respect to the intermediate layer 40, and the intermediate layer 40 arranged directly and in a positively locking manner thereon. By means of the intermediate layer 40, the mechanical stability of the radiation-emitting body can be improved and the electrical conductivity can be influenced. In order to insulate the radiation-emitting body on the rear side, the intermediate layer 40 can contain a dielectric material or SiN or silicon oxide.

In order to enable an electrical contact on the rear side, the intermediate layer 40 can contain a conductive metal oxide, for example ITO or ZnO. Preferably, the intermediate layer 40 is applied to a structured surface of the semiconductor layer sequence in a positively locking manner, for example by means of chemical vapor deposition (CVD) or physical vapor deposition (PVD). In a further embodiment, the intermediate layer 40 can be embodied such that it is at least partly electrically conductive and/or insulating. If the intermediate layer 40 is formed by a vapor deposition method, for example, then a structuring is manifested at the outer surface of the intermediate layer 40, the cause of which structuring resides in the structuring 20 of the interface 15. These unevennesses at that surface of the intermediate layer 40 which is directed toward the reflection layer 50 are eliminated by a planarization step. One example of such a planarization step is mechanical polishing.

Figure 2D:
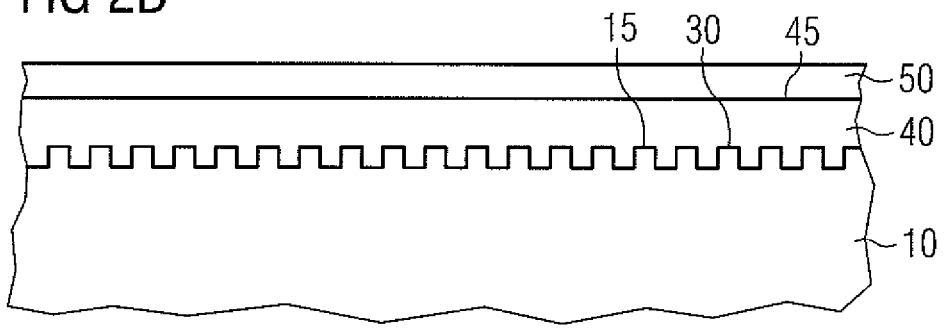

After the planarization, a substantially planar surface shown in FIG. 2D has been formed at the intermediate layer 40. The reflection layer 50 is applied thereto.

The invention is not restricted by the description on the basis of the exemplary embodiments. Rather, the invention encompasses any novel feature and also the combination of features, which in particular includes the combination of features in the patent claims, even if this feature or this combination itself is not explicitly specified in the patent claims or exemplary embodiments.

The invention claimed is:

1. A radiation-emitting body comprising:
   a layer sequence having an active layer for generating electromagnetic radiation, a reflection layer, which reflects the generated radiation, and at least one intermediate layer arranged between the active layer and the reflection layer,
   wherein the active layer has a roughening on the interface directed toward the reflection layer;
   wherein the reflection layer is substantially planar at an interface directed toward the active layer;
   wherein the roughening comprises structure elements having a structure size;
   wherein the structure size is equal to or greater than half of the wavelength of the generated electromagnetic radiation and less than or equal to double the wavelength of the generated electromagnetic radiation; and
   wherein the wavelength of the generated electromagnetic radiation lies in a wavelength range between 50 nm and 1000 nm.

2. The radiation-emitting body as claimed in claim 1, wherein the intermediate layer is transmissive to the generated radiation.

3. The radiation-emitting body as claimed in claim 1, wherein the intermediate layer has a refractive index that is not equal to the refractive index of the active layer.

4. The radiation-emitting body as claimed in claim 1, wherein the roughening comprises a lateral structuring with a multiplicity of projecting structure elements.

5. The radiation-emitting body as claimed in claim 1, wherein the radiation-emitting body is a thin-film semiconductor body.

6. The radiation-emitting body as claimed in claim 1, wherein the reflection layer contains a metal or is embodied as a metallic layer.

7. The radiation-emitting body as claimed in claim 1, wherein the reflection layer directly adjoins the intermediate layer.

8. The radiation-emitting body as claimed in claim 1, wherein the reflection layer is connected to the intermediate layer in a positively locking manner.

9. The radiation-emitting body as claimed in claim 1, wherein the intermediate layer contains a dielectric material.

10. The radiation-emitting body as claimed in claim 1, wherein the intermediate layer contains an electrically conductive material.

11. The radiation-emitting body as claimed in claim 1, wherein the intermediate layer directly adjoins the active layer.

12. The radiation-emitting body as claimed in claim 1, wherein the active layer is connected to the intermediate layer in a positively locking manner.

13. A method for producing a radiation-emitting body comprising the steps of:
   forming a layer sequence on a substrate, having an active layer for generating electromagnetic radiation;
   roughening an interface of the active layer, wherein the roughened interface comprises structure elements having a structure size; the structure size is equal to or greater than half of the wavelength of the generated electromagnetic radiation and less than or equal to double the wavelength of the generated electromagnetic radiation; and the wavelength of the generated electromagnetic radiation lies in a wavelength range between 50 nm and 1000 nm;
forming at least one intermediate layer; and
forming a reflection layer.

* * * * *